(12) United States Patent
Mai et al.

(10) Patent No.: US 10,511,323 B1
(45) Date of Patent: Dec. 17, 2019

(54) LOOP FILTER INITIALIZATION TECHNIQUE

(71) Applicant: Apple Inc., Cupertino, CA (US)

(72) Inventors: Tao Mai, Santa Clara, CA (US); Simone Gambini, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/143,447

(22) Filed: Sep. 26, 2018

(51) Int. Cl.
*H03M 1/06* (2006.01)
*H03M 3/00* (2006.01)

(52) U.S. Cl.
CPC ........... *H03M 3/436* (2013.01); *H03M 3/368* (2013.01); *H03M 3/422* (2013.01); *H03M 3/462* (2013.01)

(58) Field of Classification Search
CPC ...... H03M 3/436; H03M 3/462; H03M 3/422; H03M 3/368; H03M 1/12; H03M 1/06; H03M 1/1023; H03M 3/50; H03M 7/3004; H03M 3/30
USPC .......................................... 341/118, 155, 143
See application file for complete search history.

(56) References Cited

U.S. PATENT DOCUMENTS

| | | | |
|---|---|---|---|
| 9,136,867 B2* | 9/2015 | Watanabe | H03M 3/374 |
| 9,219,495 B2* | 12/2015 | Si | H03M 3/322 |
| 9,379,729 B2* | 6/2016 | Helio | G04F 10/005 |
| 9,537,492 B2* | 1/2017 | Alexeyev | H03L 7/085 |
| 9,564,916 B2 | 2/2017 | Bandyopadhyay | |
| 9,825,645 B1* | 11/2017 | Gaggl | H03M 3/422 |
| 2013/0342377 A1* | 12/2013 | Lin | H03M 1/48 |
| | | | 341/143 |
| 2017/0288692 A1* | 10/2017 | Kauffman | H03M 3/464 |
| 2018/0034471 A1 | 2/2018 | Verdant et al. | |
| 2018/0069567 A1 | 3/2018 | Verdant et al. | |

* cited by examiner

*Primary Examiner* — Jean B Jeanglaude
(74) *Attorney, Agent, or Firm* — Kowert, Hood, Munyon, Rankin & Goetzel, P.C.

(57) ABSTRACT

An Nth-order loop filter includes N integrators (where N is an integer value). The loop filter includes an initialization path coupled between an input to the loop filter and an input of at least one of the integrators. A control circuit is coupled to the Nth order filter. During a reset phase, the control circuit causes an initialization voltage to be sampled into a capacitance of the initialization path. During an initialization phase immediately following the reset phase, the control circuit causes the initialization voltage to be conveyed to the input(s) of the at least one integrator.

20 Claims, 8 Drawing Sheets

LOOP FILTER INITIALIZATION TECHNIQUE

BACKGROUND

Technical Field

This disclosure is directed to electronic filters, and more particularly, to techniques for initializing electronic filters.

Description of the Related Art

Loop filters are utilized in a number of different electronic systems. One common use of a loop filter is in certain types of sigma-delta analog-to-digital converter (ADC). In a sigma-delta ADC, a discrete time loop filter may be utilized. A discrete-time loop filter used in a sigma-delta ADC may provide filtering of an analog signal prior to its final conversion to the digital domain.

As used in an apparatus such as a sigma-delta ADC, a loop filter state may be periodically reset, e.g., at the Nyquist sampling rate. After a reset, the loop filter may see an input step function that produces a closed-loop step response of the system. To avoid distortion, the initialization limits that loop filter output to be within the full input scale of a quantizer that follows.

SUMMARY

A loop filter and technique for initialization of the same is disclosed. In one embodiment, an Nth-order loop filter includes N integrators (where N is an integer value). The loop filter includes an initialization path coupled between an input to the loop filter and an input to at least one of the N integrators. A control circuit is coupled to the Nth order filter. During a reset phase, the control circuit causes an initialization voltage to be sampled into a capacitance of the initialization path. During an initialization phase immediately following the reset phase, the control circuit causes the initialization voltage to be conveyed to the input of one or more of the N integrators.

In one embodiment, initialization of the loop filter includes causing state variables of the loop filter to be initialized with their respective steady state values. This may in turn allow for a fuller use of the input range of the loop filter, since the magnitude of the step response is smaller than it would be in the absence of the initialization path.

In one embodiment, the loop filter may be used in a sigma-delta analog-to-digital converter (ADC), although it is contemplated that it may be used in other applications as well. In the sigma-delta ADC embodiment, the output of the loop filter may be provided to an ADC, such as a successive approximation register (SAR) ADC. The input to the filter may be a sum of a feedback signal and an input signal to the sigma-delta ADC.

BRIEF DESCRIPTION OF THE DRAWINGS

The following detailed description makes reference to the accompanying drawings, which are now briefly described.

Figure 1:
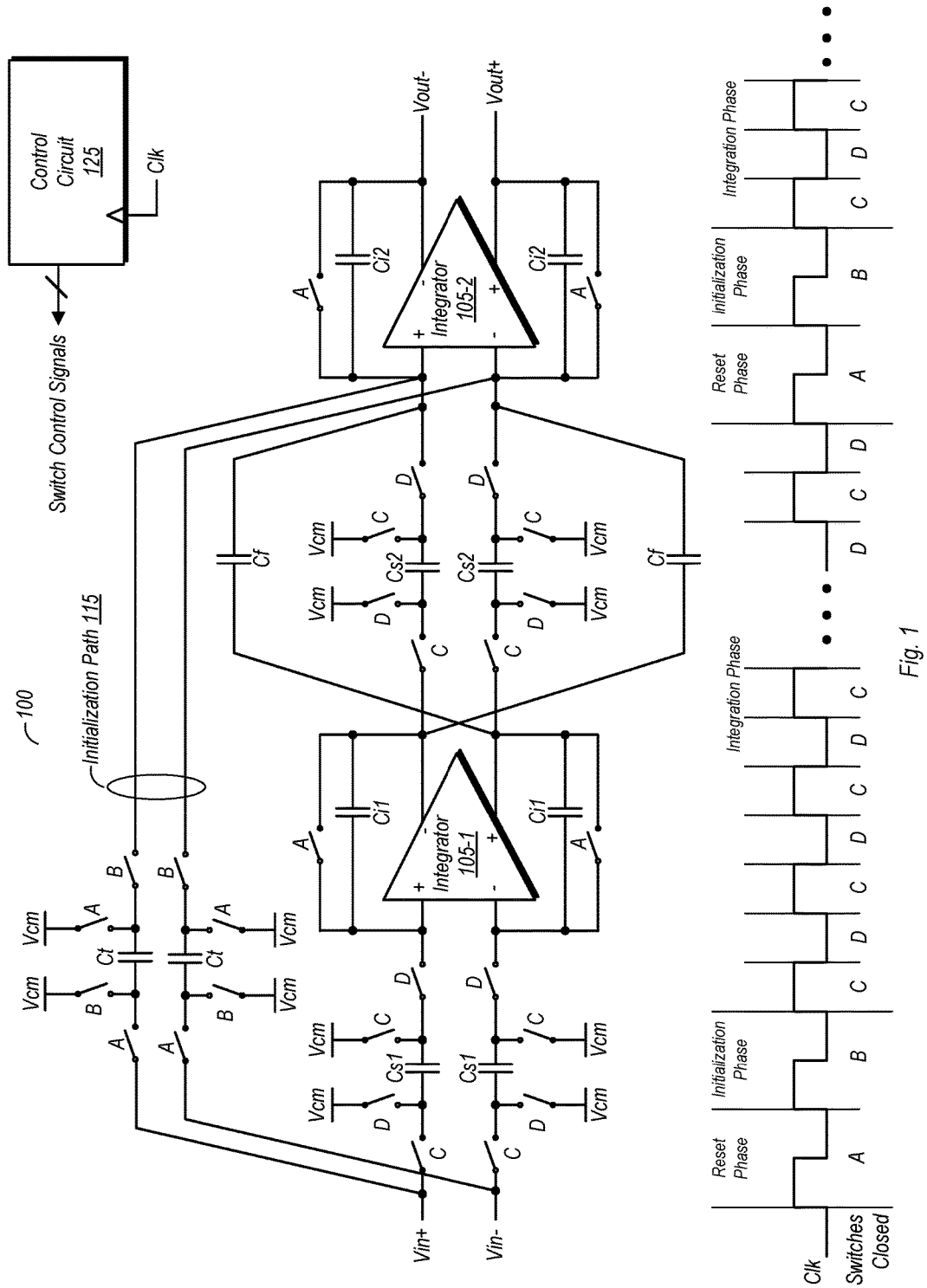
FIG. 1 is a schematic diagram of one embodiment of an Nth-order loop filter.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a loop filter and a method for initializing the same. Typical loop filters periodically undergo a reset phase, but do not have an initialization phase. Loop filters may be reset at, e.g., a Nyquist sampling rate. After a reset, a loop filter may see an input step function. The closed-loop step response of the filter may have overshoot behavior that causes the peak value of the loop filter output to exceed its steady state value. In order to avoid distortion, the loop filter output is kept within the input full-scale of, e.g., a quantizer coupled to receive the filter output (where an analog-to-digital converter, or ADC, is one example of a quantizer that receives a loop filter output). Accordingly, the input to typical loop filters may be limited to a value that is within the full-scale of the quantizer. Accordingly, the input signal range is limited.

Various embodiments of the loop filter and methods for operating the same as disclosed herein may attempt to remove some or all of the step response. By removing this step response, the overall dynamic range of a system implementing the loop filter can be increased, while correspondingly reducing power consumption of amplifiers in the loop filter. In the present disclosure, this is accomplished by adding an initialization phase following the reset phase. During the initialization phase, a version of an input voltage is sampled into the loop filter, into the input of one or more integrators therein. This is effectively the equivalent of initializing the state variables of the loop filter to their respective steady state values. Upon completion of the initialization phase, the filter may operate in its normal integration phase.

In one embodiment, the method and apparatus disclosed herein may be implemented in a sigma-delta ADC. The loop filter may be of second order or higher, and may produce a closed-loop step response function that has overshoot.

FIG. 1 is a schematic diagram of one embodiment of an Nth-order loop filter. In this particular embodiment, N=2 and thus the corresponding filter is a second order loop filter. However, it is noted that the filter may be generalized to be an Nth order filter where N can be any suitable integer value (e.g., $3^{rd}$ order, $4^{th}$ order, etc.). FIG. 1 also illustrates a control circuit for controlling the switches of filter 100, as well as a timing diagram to illustrate its operation in the reset, initialization, and integration phases.

In the embodiment shown, filter 100 includes two separate signal paths, a main path through the integrators, and an initialization path 100 that is utilized during the initialization phase. The main path extends from an input of filter 100 to its output. Initialization filter 115 extends from the input of filter 100 to the input of the second integrator, integrator 105-2. Generalizing further, an initialization path in an Nth-order filter extends between the input of that filter and the input of one or more integrators in the filter. Loop filter 100 is arranged as shown to receive a differential input signal having the components Vin+ and Vin−. The output signal in the embodiment shown is conveyed as a differential signal having the components Vout+ and Vout−.

Filter 100 includes a number of switches, labeled here as 'A', 'B', 'C', and 'D', which correspond to the respective times at which they are closed. The switches are further coupled to capacitors through which voltages are conveyed along the signal paths. The control of the switches is in turn performed by control circuit 125, which generates switch control signals in accordance with a received clock signal, Clk. The clock signal may be generated by any suitable circuit (e.g., a ring oscillator) used for clock signal generation. Control circuit 125 may be implemented as, e.g., a state machine or any other suitable logic circuit that can generate the control signals used to manipulate the various switches of loop filter 100 during its various phases of operation.

Operation in the reset phase includes the closing of each of the switches labeled A. During this time, the switches labeled B, C, and D are open. When the switches labeled A are closed (responsive to corresponding signal switches conveyed from control circuit 125), the integrator outputs are effectively short circuited to their respective inputs. For example, with integrator 105-1, its negative, or '−' output is coupled directly to its non-inverting (positive, or '+') input, bypassing a corresponding instance of Ci1. Similarly, the positive output is directly coupled to the inverting input of integrator 105-1 when switches A are closed. Similar operation occurs on integrator 105-2, and more generally, on all integrators in an Nth-order loop filter.

In addition to resetting the integrators during operation in the reset phase, the closing of switches A in the embodiment shown also samples in an initialization voltage into initialization path 115. More particularly, the differential initialization voltage is conveyed through corresponding instances of switches A to respectively coupled terminals of capacitors Ct. The other terminals of these two capacitors are coupled to a common mode voltage, Vcm. As a result, capacitors Ct are charged to voltages based on the initialization voltage input through Vin+ and Vin−.

As shown in the timing diagram of FIG. 1, the initialization phase immediately follows the reset phase. When operation of loop filter 100 transitions from the reset phase to the initialization phase, control circuit 125 provides control signals to open switches A and close switches B (switches C and D remain open). When switches B are closed, the differential initialization voltage is conveyed from capacitors Ct to the inputs of the last integrator of loop filter 100, integrator 105-2 in the particular embodiment shown in FIG. 1. The opposite terminals of capacitors Ct are coupled to the common mode voltage, Vcm, when switches B are closed. In conveying the initialization voltage to the inputs of integrator 105-2, state variables of loop filter 100 are effectively initialized to their respective steady state values. That is, the voltages and currents on/through the various nodes of the circuitry implementing loop filter 100 are initialized to values such that the circuit is in an equilibrium condition. Due to the presence of capacitors Ci2, corresponding steady state voltages are placed on the outputs nodes of loop filter 100 (Vout− and Vout+), which correspond to the output nodes of integrator 105-2 in this embodiment.

It is noted here that each of the reset and initialization phases occupy one full clock cycle, as shown in the timing diagram at the bottom of FIG. 1. However, embodiments are possible and contemplated in which one or both of the reset and/or initialization phases occupy more or less than one full clock cycle.

Upon completion of the initialization phase, operation in the integration phase begins, and can last any suitable number of clock cycles until the next instance of the reset phase. In one embodiment in which loop filter 100 is implemented in a sigma-delta ADC, the reset and initialization phases may be based on the Nyquist frequency at which an incoming signal is sampled and converted to the digital domain. However, other embodiments are possible and contemplated, with the periodicity of the reset and initialization phases occurring at intervals that are suitable for the particular application.

In the integration phase, switches A and B are open, while switches C and D are alternately opened and closed. In this particular example, switches C are closed when the clock signal is high, while switches D are closed when the clock signal is low. When switches C are closed, the input signal is conveyed to terminals of capacitors Cs1, while the output signal from integrator 105-1 is conveyed to capacitors Cs2. Additionally, the other terminals of capacitors Cs1 and Cs2 are coupled to the common mode voltage Vcm. When switches D are closed, signals are conveyed directly to the inputs of integrators 105-1 and 105-2, while the opposite terminals of the capacitors Cs1 and Cs2 are coupled to the common mode voltage.

Figure 2:
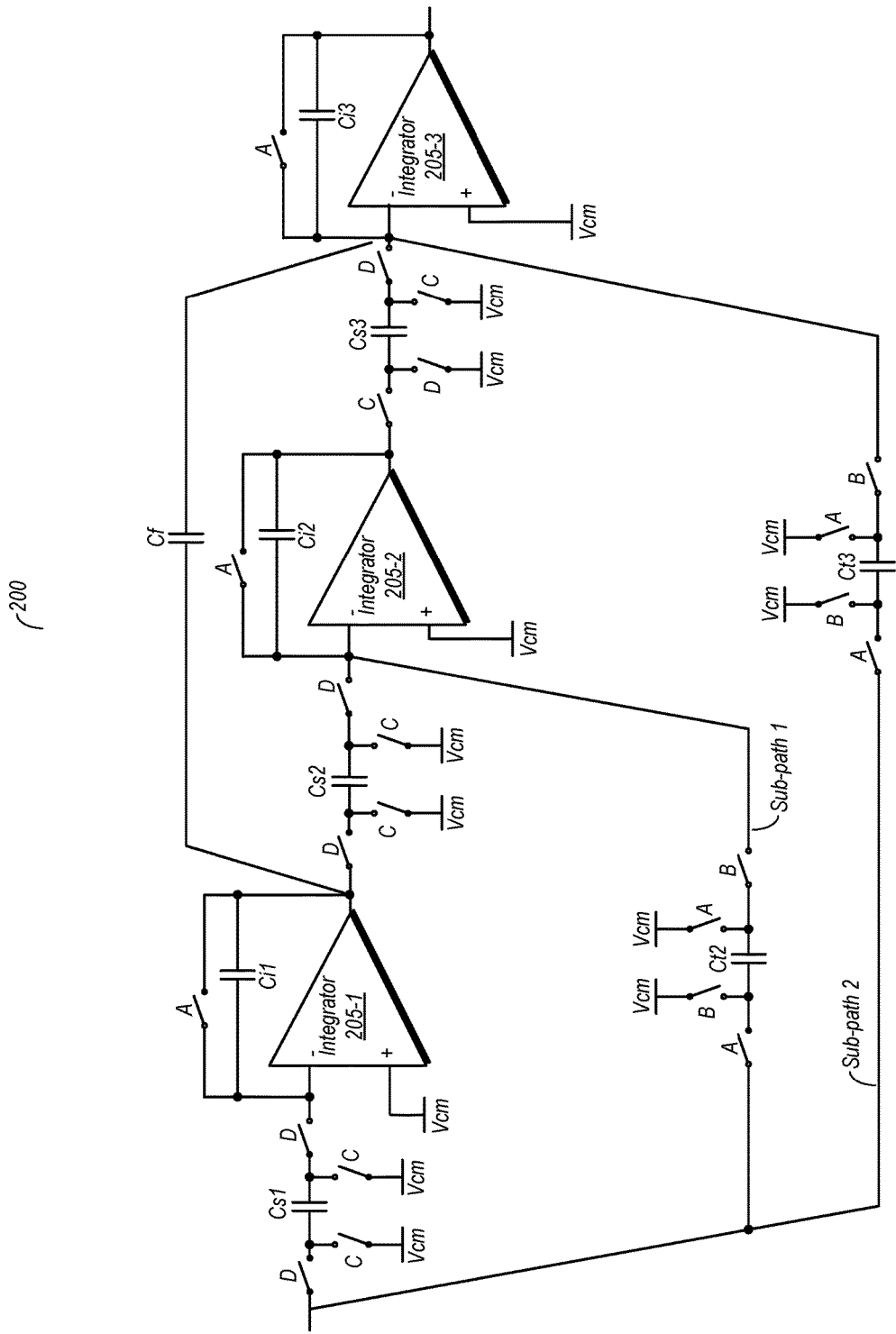
FIG. 2 is a schematic diagram of another embodiment of an Nth-order loop filter.

FIG. 2 is a schematic diagram of another embodiment of a filter. For the sake of illustration, no control circuit is shown in FIG. 2, although it is understood that control circuitry is used to manipulate the switches. Furthermore, the switching sequence in filter 200 of FIG. 2 is understood to be the same as that of FIG. 1, and thus no timing diagram is shown. Finally, while filter 200 is shown as having single-ended signal paths, similar embodiments having differential signal paths (as shown in FIG. 1) are possible and contemplated.

Filter 200 in the embodiment shown includes an initialization path having two sub-paths, sub-path 1 and sub-path 2. Via sub-path 1, integrator 205-2 is initialized, while integrator 205-3 is initialized via sub-path 2. The capacitance values in the sub-paths, Ci2 and Ci3, may be different from one another, and thus the state variables at which the integrators are initialized may also be different.

Generally speaking, the present disclosure contemplates a loop filter having an initialization path between the filter input and an input to at least one integrator. As shown in FIG. 2, sub-paths may be implemented in the initialization path to allow each integrator to be initialized with corresponding state variables at their steady state values. Thus, in accordance with the generalized embodiment of a filter discussed herein, including an initialization path coupled between the filter input and inputs to one or more integrators, the present disclosure also contemplates utilizing the initialization path to initialize the state variables of the filter to their respective steady state values.

Figure 3:
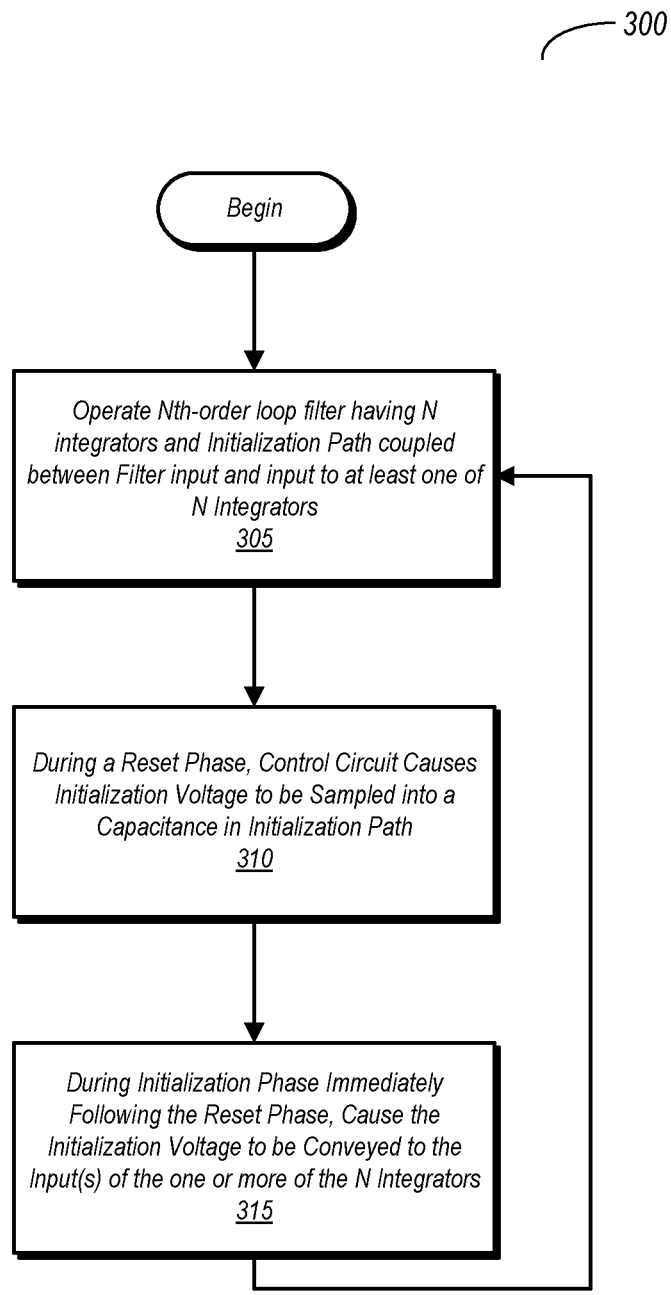
FIG. 3 is a flow diagram illustrating one embodiment of a method for initializing a filter.

FIG. 3 is a flow diagram illustrating one embodiment of a method for initializing a filter. Method 200 may be performed with the embodiment of loop filter 100 discussed above with reference to FIG. 1, and additionally, with any Nth-order loop filter having an initialization path.

Method 300 begins with operating an Nth-order loop filter having N integrators and an initialization path coupled between an input to the loop filter and inputs of one or more of the N integrators of the loop filter (block 305). The method further includes a control circuit, during a reset phase, causing an initialization voltage to be sampled into a capacitance of the initialization path (block 310). The method further includes, during an initialization phase immediately following the reset phase, causing the initialization voltage to be conveyed to the input(s) of the one or more of the N integrators (block 315). The method then returns to block 305.

In various embodiments, the method may include the control circuit, during the reset phase, closing each a first plurality of switches, the first plurality of switches including a first subset in the initialization path (e.g., switches A coupled to capacitors Ct). The method may further include, during the initialization phase, closing each of a second plurality of switches (e.g., switches B of FIG. 1) and opening each of the first plurality of switches. The first plurality of switches includes a second subset of switches (e.g., switches A coupled between the integrator outputs and integrator inputs as shown in FIG. 1), wherein each of the second subset of switches is coupled between an output of an associated integrator and an input of the associated integrator, wherein, when closed, each of the second subset of switches short circuits an output of its associated integrator and a corresponding input of its associated integrator.

Various embodiments of method 300 may further include the control circuit operating third and fourth pluralities of switches. The control circuit is configured to, during the integration phase, control the third and fourth pluralities of switches such that each of the third plurality of switches are closed and each of the fourth plurality of switches are open when a clock signal is high, and wherein each of the third plurality of switches are open and each of the fourth plurality of switches when a clock signal is low.

Embodiments of method 300 include the control circuit periodically causing the loop filter to enter the reset phase and the initialization phase. The initialization voltage is based on steady state values of state variables of the Nth-order loop filter.

Figure 4:
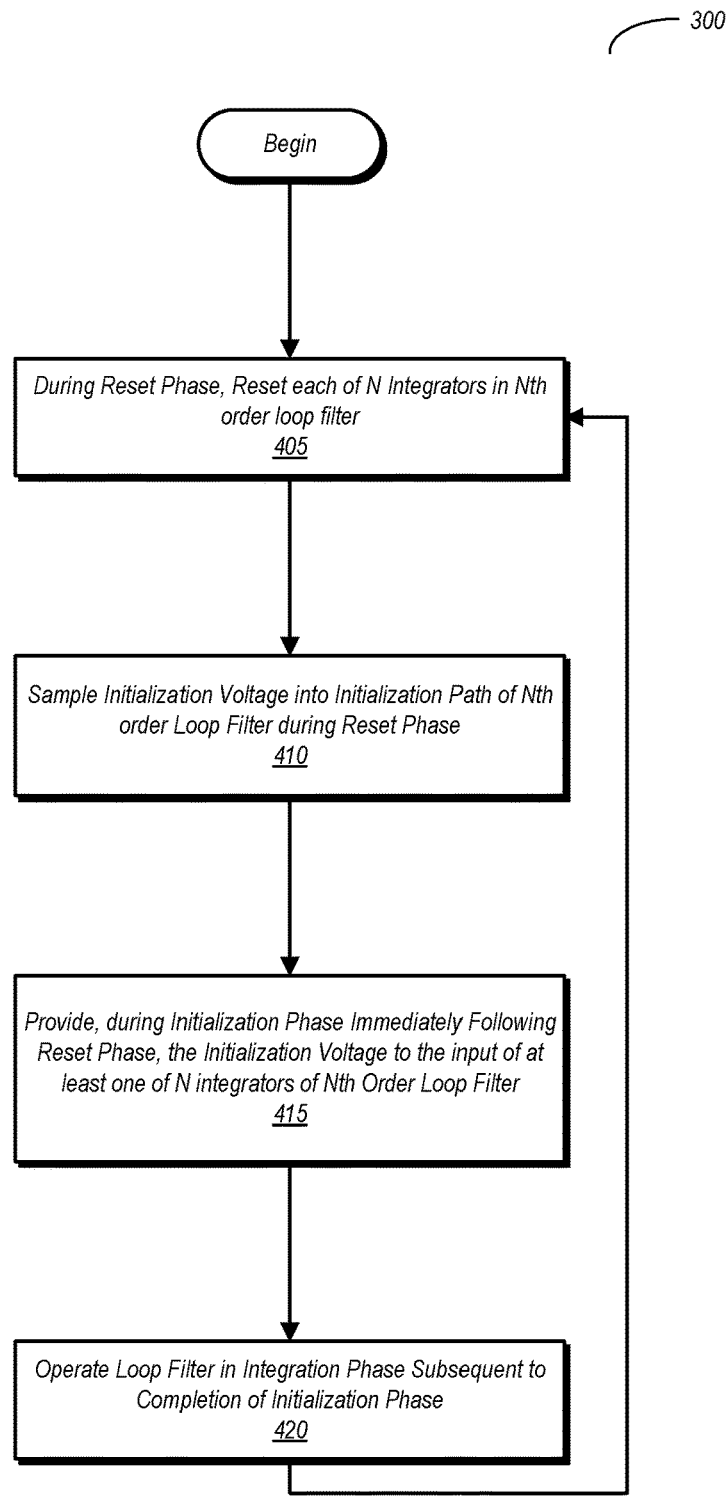
FIG. 4 is a flow diagram illustrating another embodiment of a method for initializing a filter.

FIG. 4 is a flow diagram illustrating another embodiment of a method for initializing a filter. As with method 300, method 400 may be performed with the embodiments of loop filter 100 shown in FIG. 1, loop filter 200 as shown in FIG. 2, and more generally, any Nth-order filter falling within the scope of this disclosure.

Method 400 begins with resetting each of N integrators in an Nth order loop filer during a reset phase (block 405). The method further includes, during the reset phase, sampling an initialization voltage into an initialization path of the Nth order loop filter (block 410). During an initialization phase immediately following reset phase, the method includes providing the initialization voltage to input(s) of at least one integrator of the Nth order loop filter (block 415). Method 400 includes operating the loop filter in an integration phase subsequent to completion of the initialization phase (block 420). Thereafter, method 400 returns to block 405.

In various embodiments, providing the initialization voltage to inputs of at least one of the N integrators comprises initializing the Nth order loop filter state variables with their respective steady state values. Sampling the initialization voltage comprises charging capacitors in the initialization path, and wherein providing the initialization voltage to the input of the Nth integrator comprises conveying the initialization voltage from the capacitors in the initialization path. In some embodiments, an initialization path may include two or more sub-paths, each sub-path coupled to inputs of corresponding ones of the N integrators. Thus, respective initialization voltages may be provided to the inputs of each of the corresponding integrators. The initialization voltages respectively received by each of the correspondingly coupled integrators cause various state values associated with those integrators to be initialized to respective steady state values.

In operating the loop filter, the method may include closing each of a first plurality of switches during the reset phase, the first plurality of switches including a first subset of switches in the initialization path and closing each of a second plurality of switches during the initialization phase, wherein each of the second plurality of switches is implemented in the initialization path. Each of the second plurality of switches are open during the reset phase, and wherein each of the first plurality of switches are open during the initialization phase.

During operation in the integration phase, the method may include closing each of a third plurality of switches when a clock signal is high and closing each of a fourth plurality of switches when the clock signal is low. Switches of only one of the first, second, third, and fourth pluralities of switches is closed at any given time. The method may also include closing switches of a second subset of the first plurality of switches during the reset phase, wherein closing switches of the second subset comprises creating a short circuit between a respective output and a respective input of each of the N integrators.

In one embodiment, the loop filter may be implemented in a sigma-delta ADC. Corresponding method embodiments may include providing an output signal from the Nth order loop filter to an successive approximation register (SAR) analog-to-digital converter (ADC) within the sigma-delta ADC. Such a method further includes outputting a digital value from SAR ADC.

Various embodiments of the method include periodically performing the reset phase and the initialization phase.

Figure 5:
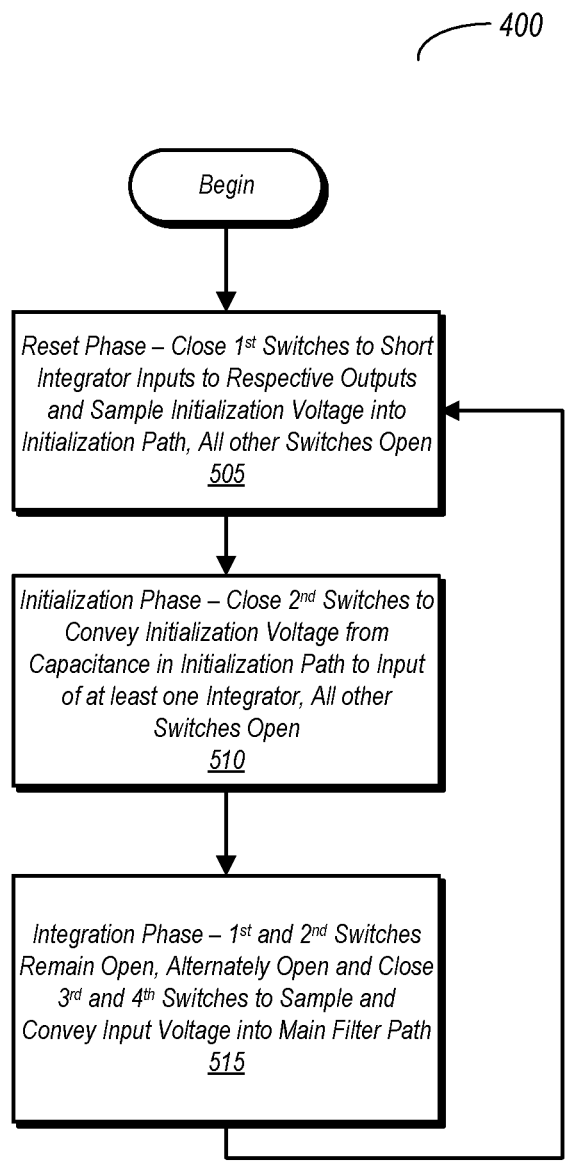
FIG. 5 is a flow diagram illustrating an embodiment of a method for operating a loop filter.

FIG. 5 is a flow diagram illustrating another embodiment of a method for operating a loop filter. Method 500 may be performed using various embodiments of an Nth order loop filter that includes an initialization path.

In this particular embodiment, operation of the loop filter is divided into three phases. A first phase is the reset phase. The reset phase includes closing a first set of switches to short integrator inputs to their respective outputs, and additionally to sample an initialization voltage into an initialization path (block 505). During this portion of the operation, only switches of the first set are closed, while all other switches remain open. The initialization path includes a capacitance, implemented with one or more capacitors or a bank thereof that receives the initialization voltage. These capacitors are then charge in accordance with the received initialization voltage. In embodiments having two or more sub-paths in the initialization path, corresponding capacitances may be implemented in each of the same. The capacitance values may be selected such that state variables of each of the correspondingly coupled integrators are initialized to respective steady state values. Accordingly, the capacitances implemented in each of the respective sub-paths may be different with respect to one another.

Upon completion of the reset phase, operation of the loop filter enters the initialization phase. In the initialization phase, a second set of switches is closed (with all other switches being open), and the initialization voltage is conveyed from the capacitance to the input(s) of the last integrator (block 510), by injecting the charge from this capacitance. When the initialization voltage is conveyed to the inputs of the integrators coupled to the initialization path, state variables of the loop filter are effectively initialized with steady state values. In initializing the filter in this manner, a step response is greatly reduced, if not eliminated, upon beginning operation of the filter in the subsequent integration phase.

After completing the initialization, operation progresses to the integration phase. In the integration phase, the first and second sets of switches remain open, while third and fourth sets of switches are opened and closed (block 515), sampling an input voltage into the main path of the filter and conveying signals along the same.

As noted above, FIG. 1 is a second order filter, but the method and apparatus embodiments described herein may be generalized to Nth order filters where N is an integer value such as that shown in FIG. 2. A first part of this generalization includes identifying the output state variables of each of the N integrators. After identifying the output state variables for each of the N integrators, the respective steady state values of the output state variables may be determined by solving an Nth-order equation system, using the assumption that the input of each of the N integrators is zero in the steady state, with infinite DC gain for each integrator. Upon identifying the steady state values of the state variables, and assuming the loop filter is implemented using a switched-capacitor topology similar to the one of FIGS. 1 and/or 2 (e.g., having the integration capacitors such as Ci1, Ci2, etc.), extra switch capacitor samplers are added (e.g., such as Ct1, Ct2 of FIG. 1). Finally, a control circuit is added to implement the clock phases as shown in the timing diagram of FIG. 1. During operation in the reset phase, the state of every integrator is cleared. The reset phase is then followed by an initialization phase in which initialization voltage(s) sampled into the initialization path (during the reset phase) is/are conveyed to the input(s) of various ones of the integrators, thereby initializing the state variables of the loop filter to steady state values.

Figure 6:
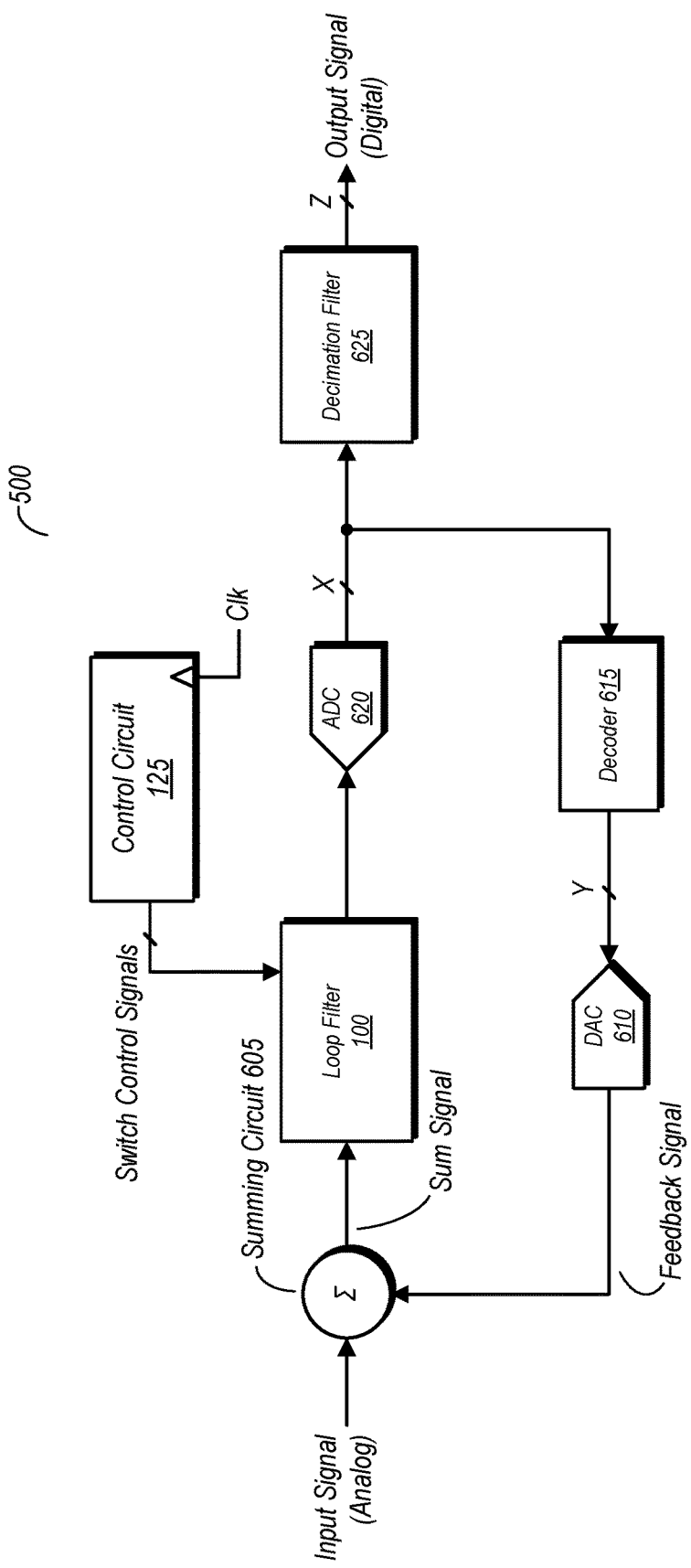
FIG. 6 is a block diagram of one embodiment of a sigma-delta analog-to-digital converter having a loop filter.

FIG. 6 is a block diagram of one embodiment of a sigma-delta ADC that includes an embodiment of a loop filter 100 or loop filter 200 as discussed above. For the sake of illustration, discussion here is focused on loop filter 100, although various embodiments of the sigma-delta ADC may use any loop filter embodiment falling within the scope of this disclosure. It is noted that this particular application of a loop filter is shown for the sake of example, but the loop filter and method of operating the same as discussed above is not limited to sigma-delta ADCs and may be implemented in any apparatus in which the use of a loop filter is suitable.

Sigma-delta ADC 600 includes a summing circuit 605 that is coupled to receive an input analog signal and an analog feedback signal. These signals are summed in the analog domain, with a resulting sum signal output to loop filter 100. Loop filter 100 then performs a filtering operation in accordance with the operation described herein. The operation of loop filter 100 is controlled by control circuit 125, which generates switch control signals and changes the state of these signals in accordance with a received clock signal.

The output signal from loop filter 100 is conveyed to ADC 620. In this particular embodiment, ADC 620 is a successive approximation register ADC, although any suitable type of ADC may be utilized. ADC 620 outputs a digital signal having X bits (where X is an integer value) to decimation filter 625. Decimation filter 625 reduces the sampling rate associated with the digital signal, outputting a corresponding digital signal having a number of bits equal to the integer value Z.

The output of ADC 620 is also provided into a feedback path, to decoder 615 specifically in this embodiment. Decoder 515 transforms the X bit signal into a corresponding signal having Y bits, Y also being an integer value. The Y bit signal is received by digital-to-analog converter (DAC) 610, which generates a corresponding analog feedback signal that is then input into summing circuit 605.

Figure 7:
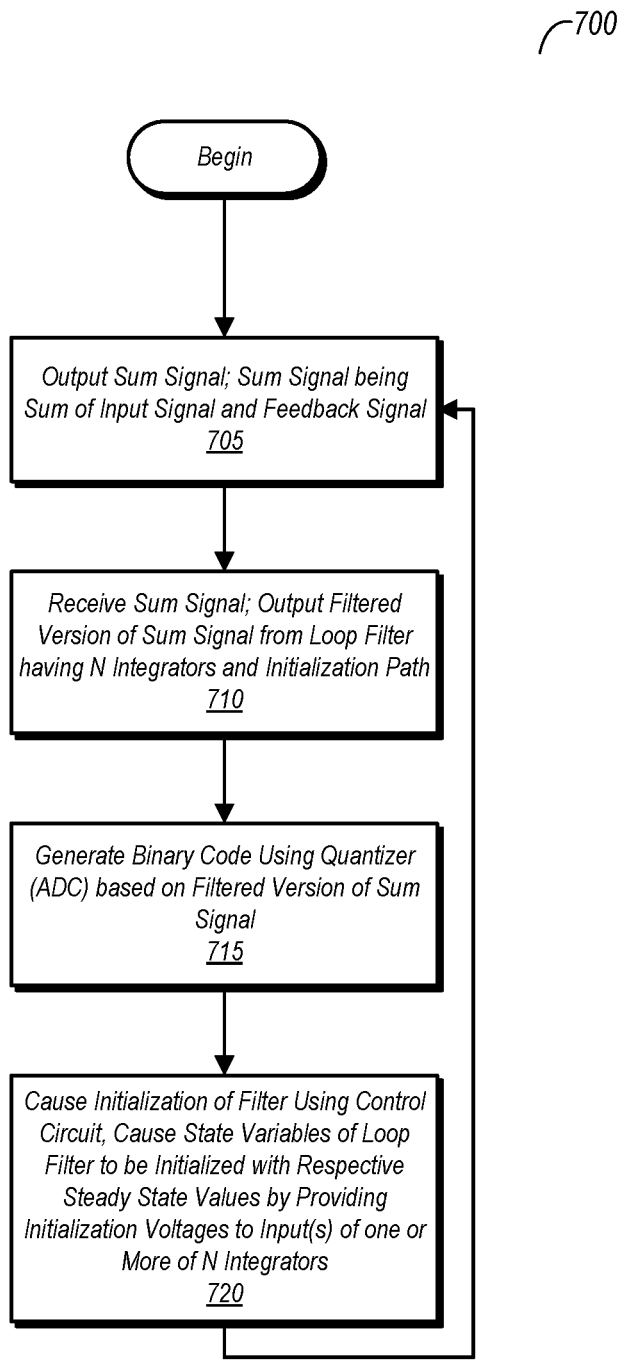
FIG. 7 is a flow diagram illustrating an embodiment of a method for operating a sigma-delta ADC.

FIG. 7 is a flow diagram illustrating an embodiment of a method for operating a sigma-delta ADC. The sigma-delta ADC may include an embodiment of a loop filter as discussed above, and thus includes operation in the reset, initialization, and reset phases. The sigma-delta ADC is coupled to a control circuit that controls operation of the loop filter.

Method 700 begins with the outputting of a sum signal, the sum signal being the sum of an input signal and a feedback signal (block 705). The sum signal is received a loop filter configured to output a filtered version of the sum signal, the loop filter including N integrators and an initialization path (block 710). A quantizer (e.g., such as ADC 620 shown in FIG. 6) is configured to generate a binary code based on the filtered version of the sum signal (block 715). The control circuit is configured to, during an initialization phase, cause state variables of the loop filter to be initialized with their respective steady state values, wherein initializing the loop filter includes providing an initialization voltage to an Nth integrator via the initialization path (block 720).

Operation further includes, during the reset phase, the closing of each a first plurality of switches, the first plurality of switches including a first subset in the initialization path. During the initialization phase, operation includes closing of each of a second plurality of switches and open each of the first plurality of switches. The first plurality of switches includes a second subset of switches, each of the second subset of switches being coupled between an output of an associated integrator and an input of the associated integrator. When closed, each of the second subset of switches short circuits an output of its associated integrator and a corresponding input of its associated integrator. The control circuit is configured to periodically reset the loop filter by initiating the reset phase and further configured to follow each instance of the reset phase with an instance of the initialization phase.

As noted above, one embodiment of the sigma-delta ADC includes a successive approximation register (SAR) ADC coupled to receive an output signal from the loop filter and configured to generate a corresponding digital value. The decimation filter is coupled to receive the digital value from the SAR ADC and configured to reduce a sampling rate of the digital value. The decoder is coupled to receive the digital value from the SAR ADC and configured to generate a thermometer code based thereon. The digital-to-analog converter (DAC) is configured to convert the thermometer code into a feedback analog signal. The summing circuit is coupled to generate a sum analog signal based on the analog feedback signal and an input analog signal and coupled to provide the sum analog signal to an input of the Nth order loop filter. The analog feedback signal is based on an output from the SAR ADC, which is also conveyed into the signal path having the decoder and the DAC.

Figure 8:
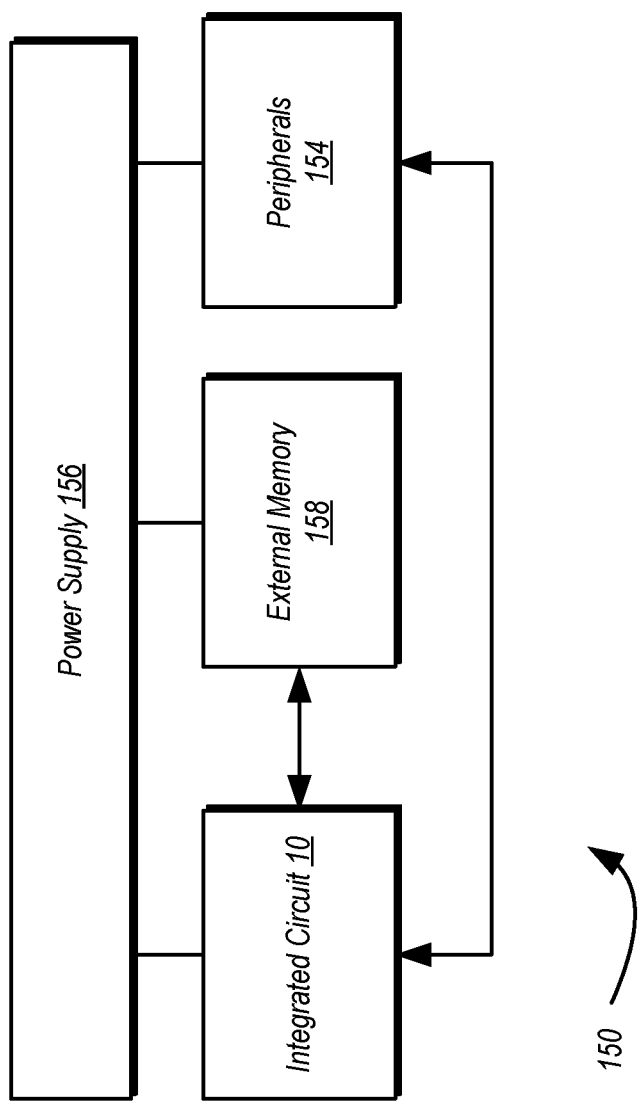
FIG. 8 is a block diagram of one embodiment of an example system.

Turning next to FIG. 8, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

In various embodiments, integrated circuit 10 and/or peripherals 154 may include implementations of the various types of circuitry/hardware discussed above with reference to FIGS. 1, 2, and 5. Such circuitry/hardware may be capable of carrying out the various methods of FIGS. 3-5 and 7.

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
an Nth-order loop filter having N integrators and an initialization path coupled between an input to the loop filter and an input to at least one of the N integrators; and
a control circuit configured to:
during a reset phase, cause an initialization voltage to be sampled into a capacitance of the initialization path; and
during an initialization phase immediately following the reset phase, cause the initialization voltage to be conveyed to the input of the at least one of the N integrators.

2. The apparatus as recited in claim 1, wherein the control circuit is configured to:
during the reset phase, close each a first plurality of switches, the first plurality of switches including a first subset in the initialization path; and
during the initialization phase, close each of a second plurality of switches and open each of the first plurality of switches.

3. The apparatus as recited in claim 2, wherein the first plurality of switches includes a second subset of switches, wherein each of the second subset of switches is coupled between an output of an associated integrator and an input of the associated integrator, wherein, when closed, each of the second subset of switches short circuits an output of its associated integrator and a corresponding input of its associated integrator.

4. The apparatus as recited claim 2, further comprising third and fourth pluralities of switches, wherein the control circuit is configured to, during an integration phase, control the third and fourth pluralities of switches such that each of the third plurality of switches are closed and each of the fourth plurality of switches are open when a clock signal is high, and wherein each of the third plurality of switches are open and each of the fourth plurality of switches when a clock signal is low.

5. The apparatus as recited in claim 1, wherein the control circuit is configured to periodically cause the loop filter to enter the loop filter to enter the reset phase and the initialization phase.

6. The apparatus as recited in claim 1, wherein the initialization voltage is based on steady state values of state variables of the Nth-order loop filter.

7. The apparatus as recited in claim 1, further comprising a successive approximation register (SAR) analog-to-digital converter (ADC) coupled to receive an output signal from the Nth order loop filter.

8. The apparatus as recited in claim 7, further comprising a summing circuit coupled to an input of the loop filter, wherein the summing circuit is configured to generate a signal that is a sum of an input signal and a feedback signal, the feedback signal being based on an output from the SAR ADC.

9. A method comprising:
during a reset phase, resetting each of N integrators in an Nth order loop filer;
sampling an initialization voltage into an initialization path of the Nth order loop filter during the reset phase;
providing, during an initialization phase immediately following the reset phase, the initialization voltage to inputs of at least one of the N integrators the Nth order loop filter; and
operating the loop filter in an integration phase subsequent to completion of the initialization phase.

10. The method as recited in claim 9, wherein providing the initialization voltage comprises initializing Nth order loop filter state variables with their respective steady state values.

11. The method as recited in claim 9, wherein sampling the initialization voltage comprises charging capacitors in the initialization path, and wherein providing the initialization voltage to inputs of at least one of the N integrators comprises conveying the initialization voltage from the capacitors in the initialization path.

12. The method as recited in claim 8, further comprising:
closing each of a first plurality of switches during the reset phase, the first plurality of switches including a first subset of switches in the initialization path; and
closing each of a second plurality of switches during the initialization phase, wherein each of the second plurality of switches is implemented in the initialization path;
wherein each of the second plurality of switches are open during the reset phase, and wherein each of the first plurality of switches are open during the initialization phase.

13. The method as recited in claim 12, further comprising:
closing each of a third plurality of switches during the integration phase when a clock signal is high; and
closing each of a fourth plurality of switches during the integration phase when the clock signal is low;
wherein switches of only one of the first, second, third, and fourth pluralities of switches is closed at any given time.

14. The method as recited in claim 12, further comprising closing switches of a second subset of the first plurality of switches during the reset phase, wherein closing switches of the second subset comprises creating a short circuit between a respective output and a respective input of each of the N integrators.

15. The method as recited in claim 9, further comprising:
providing an output signal from the Nth order loop filter to an successive approximation register (SAR) analog-to-digital converter (ADC); and
outputting a digital value from SAR ADC.

16. The method as recited in claim 9, further comprising periodically performing the reset phase and the initialization phase.

17. A system comprising:
a control circuit; and
a sigma-delta analog-to-digital converter (ADC), the sigma-delta ADC including:
a summing circuit configured to output a sum signal, the sum signal being a sum of an input signal and a feedback signal;
a loop filter configured to output a filtered version of the sum signal, the loop filter including N integrators and an initialization path; and
a quantizer configured to generate a binary code based on the filtered version of the sum signal;
wherein the control circuit is configured to, during an initialization phase, cause state variables of the loop filter to be initialized with their respective steady state values, wherein initializing the loop filter includes providing an initialization voltage to an Nth integrator via the initialization path.

18. The system as recited in claim 17, wherein the control circuit is configured to:
during the reset phase, close each a first plurality of switches, the first plurality of switches including a first subset in the initialization path; and during the initialization phase, close each of a second plurality of switches and open each of the first plurality of switches;

wherein the first plurality of switches includes a second subset of switches, wherein each of the second subset of switches is coupled between an output of an associated integrator and an input of the associated integrator, wherein, when closed, each of the second subset of switches short circuits an output of its associated integrator and a corresponding input of its associated integrator.

19. The system as recited in claim 17, wherein the control circuit is configured to periodically reset the loop filter by initiating the reset phase and further configured to follow each instance of the reset phase with an instance of the initialization phase.

20. The system as recited in claim 17, wherein the sigma-delta ADC further includes:

a successive approximation register (SAR) ADC coupled to receive an output signal from the loop filter and configured to generate a corresponding digital value;

a decimation filter coupled to receive the digital value from the SAR ADC and configured to reduce a sampling rate of the digital value;

a decoder coupled to receive the digital value from the SAR ADC and configured to generate a thermometer code based thereon;

a digital-to-analog converter (DAC) configured to convert the thermometer code into a feedback analog signal; and a summing circuit coupled to generate a sum analog signal based on the feedback analog signal and an input analog signal and coupled to provide the sum analog signal to an input of the Nth order loop filter.

* * * * *